(12) United States Patent
Hopper et al.

(10) Patent No.: US 6,838,711 B1
(45) Date of Patent: Jan. 4, 2005

(54) POWER MOS ARRAYS WITH NON-UNIFORM POLYGATE LENGTH

(75) Inventors: Peter J. Hopper, San Jose, CA (US); Philipp Lindorfer, San Jose, CA (US); Vludislav Vashchenko, Palo Alto, CA (US); Rob Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/658,432

(22) Filed: Sep. 8, 2003

(51) Int. Cl.$^7$ .............................................. H01L 27/10
(52) U.S. Cl. ...................... 257/204; 257/202; 257/206
(58) Field of Search ................................ 257/202, 204, 257/206

(56) References Cited

U.S. PATENT DOCUMENTS 4,636,979 A * 1/1987 Donoghue .................. 365/104
6,639,575 B1 * 10/2003 Tsunashima et al. .......... 345/92

FOREIGN PATENT DOCUMENTS

JP          62002666 A  *  1/1987  ........... H01L/29/80

* cited by examiner

*Primary Examiner*—Allan R. Wilson
(74) *Attorney, Agent, or Firm*—Jurgen Vollrath

(57) ABSTRACT

In a MOS array, current loss at distances further away from the drain and source contacts is compensated for by adjusting the length of the polygate. In an array with drain and source contacts near the middle of the structure, the length of the polygate tapers off along the width of the polygate towards both ends of the polygate.

13 Claims, 2 Drawing Sheets

US 6,838,711 B1

POWER MOS ARRAYS WITH NON-UNIFORM POLYGATE LENGTH

FIELD OF THE INVENTION

The invention relates to the field of power MOS arrays. In particular it relates to a new MOS array structure.

BACKGROUND OF THE INVENTION

For high power applications, e.g. for powering large microprocessors that operate at 2V and sink approximately 50 A, single semiconductor devices are typically inadequate to provide the requisite power. Power transistors in the form of arrays of transistors are commonly used. These comprise arrays of transistors connected in parallel. FIG. 1 shows a plan view of a typical rectangular array 100 of NMOS devices. Each polygate 102 supports a plurality of drains and sources (not shown) to define a plurality of NMOS transistors. For each polygage, the drains and sources are typically arranged as opposed, staggered, comb-like structures to define alternating drains and sources extending along both sides of the polygate for the width of the polygate 100.

Array structures are also formed from other devices such as LDMOS, but due to the octagonal configuration of LDMOS devices, such arrays typically have a honeycomb-like layout.

SUMMARY OF THE INVENTION

The present invention comprises a power MOS array having at least one polygate supporting a plurality of sources and drains connected in parallel, wherein the polygate has a non-uniform length along its width. Typically the array includes a common drain interconnect and a common source interconnect. The drain and source interconnects may have a comb-like configuration. Preferably drain and source interconnects are opposed and staggered to define an alternating drain and source regions on either side of the polygate and extending substantially along the width of the polygate. The drain interconnect and source interconnect may each have at least one metal contact with the length of the polygate being shorter at greater distances from the at least one contact. The array may, for example, have only one drain contact and one source contact if the drain and source regions do not alternate. Instead there may be a drain contact on each side of the polygate and a source contact on each side of the polygate if the drain and source regions are staggered. Each drain contact may be in the middle of a drain interconnect and each source contact may be in the middle of a source interconnect. The polygate in such an embodiment typically is longer in the middle and gets shorter towards the ends. The change in length of the polygate may be non-linear. Preferably the decrease in length of the polygate further away from the drain and source contacts corresponds to the increase in resistance along the interconnect as one moves further from the drain and source contacts.

DETAILED DESCRIPTION OF THE INVENTION

Figure 1:
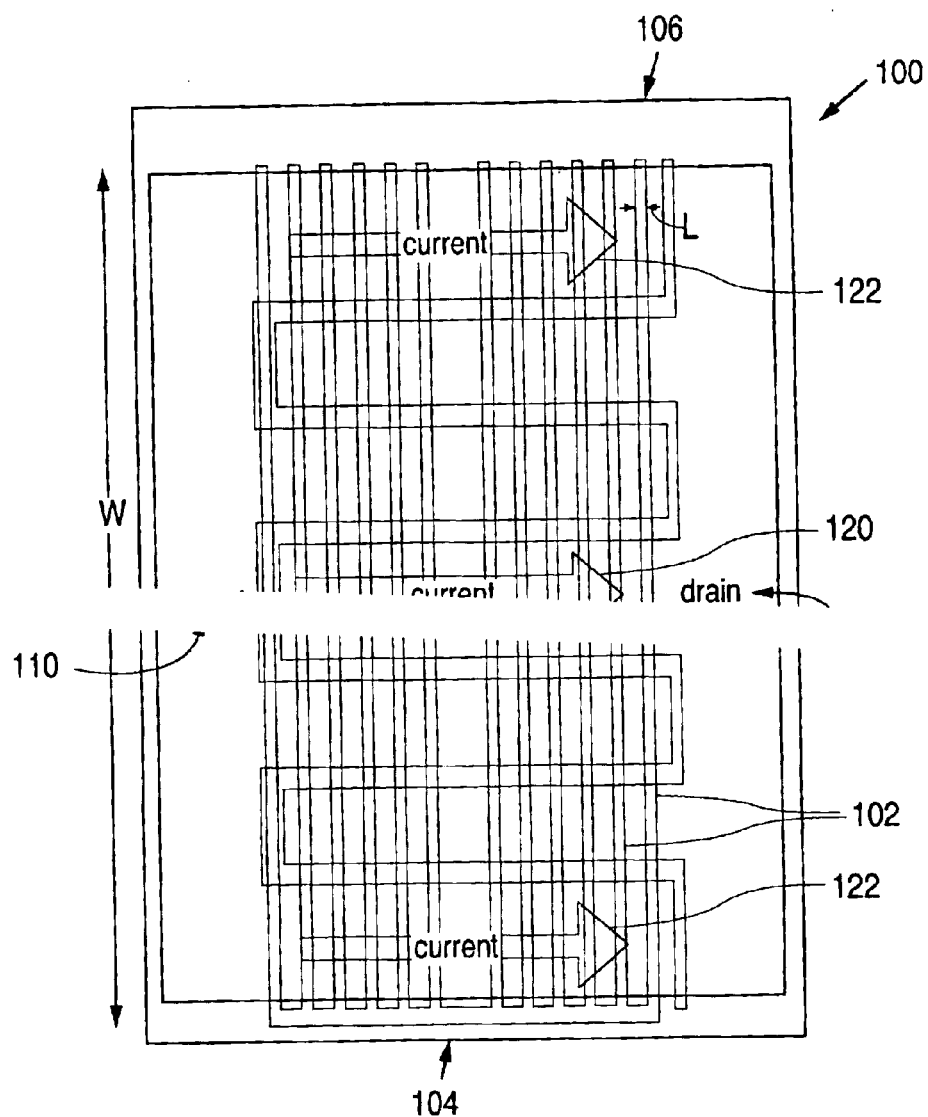
FIG. 1 shows a plan view of a prior art power MOS array.
Figure 2:
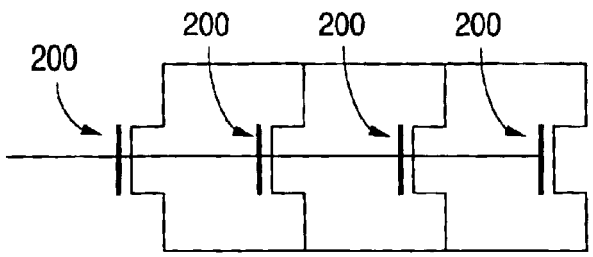
FIG. 2 is a schematic representation of part of the array of FIG. 1.
Figure 3:
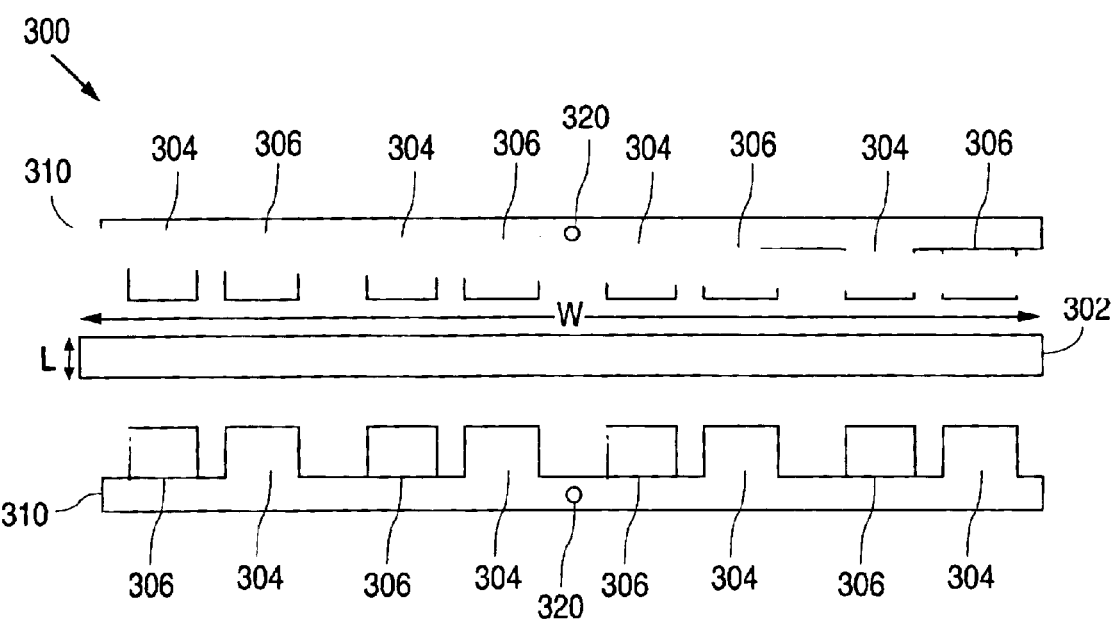
FIG. 3 shows a simple prior art power MOS array having a single polygate.

In order to best understand the present invention it is useful to consider again the prior art array shown in FIGS. 1 as well as the prior art depictions in FIGS. 2 and 3. The array 100 shows 12 polysilicon gates 102 extending from one end 104 to the other 106. The location of the source contact and the drain contact are shown by reference numerals 110 and 112, although the contacts are not actually shown in FIG. 1. Although not shown, in order to connect the MOS devices of the array in parallel, comb-like interconnects extend from one end 104 to the other end 106 for each of a plurality of drains and sources that are spaced along the width W of each polysilicon gate 102.

The principle of connecting numerous transistors in parallel in order to handle the high power current requirements is best illustrated in the schematic circuit diagram of FIG. 2, which shows three NMOS transistors with their gates 200 connected in parallel. In practice the plurality of transistors are simply produced with a common polygate as shown in FIGS. 1 and 3.

FIG. 3 shows an array 300 with a single polysilicon gate 302. A plurality of sources 304 and a plurality of drains 306 are shown extending along the width W of the polysilicon gate 302. As shown in FIG. 3, the source interconnects 310 and drain comb-like structures in this embodiment are staggered to provide alternating drain and source regions along both sides of the polygate 302. As in the embodiment of FIG. 1, there is only one source contact 320 on each side of the polygate 302, for the source interconnects 310, and one drain contact (not shown because it is to the lower metal interconnect layer) on each side of the polygate 302, for the drain interconnects. Thus, the current supplied to the drain contact will experience a resistance presented by the drain interconnect which gets progressively larger the further one moves from the drain contact. Similarly current experiences an increasing resistance as the distance from the source contact 320 increases. Thus the drain regions 306 and source regions 304 that are further from the center of the structure 300 (where the drain and source contacts are) will receive less current. This is illustrated in FIG. 1 by the wider arrow 120 in the middle of the structure, and the narrower arrows 122 toward the ends 104, 106. It should be noted that the gate length remains unvaried at L, along its entire width W.

The present invention compensates for this current loss by providing for reduced polygate impedance as one moves further away from the center of the structure 300. This is done by reducing the length L of the polygate as one moves toward the ends of the array structure.

Figure 4:
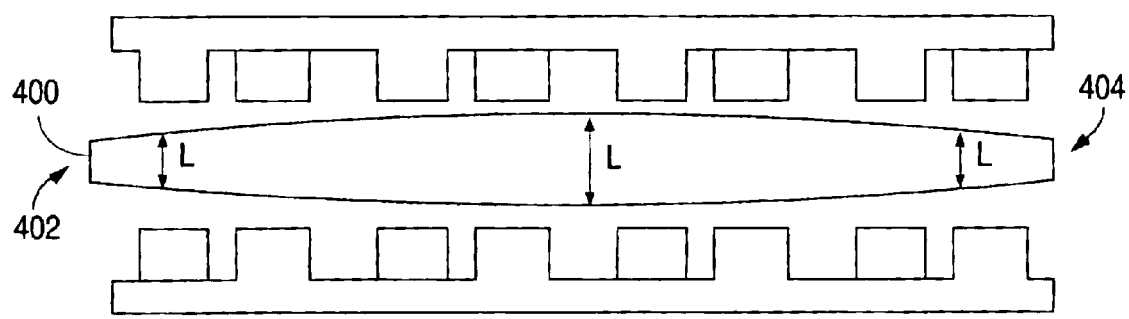
FIG. 4 shows a simple power MOS array of the invention having a single polygate of non-uniform length.

This is illustrated in FIG. 4, which shows the polygate 400 getting shorter (reduced length L) as one moves away from the center toward the ends 402,404.

While some embodiments have used a linear decrease in polygate length, a non-linear decrease as shown in FIG. 4 is preferable. Ideally the reduction in polygate length should be a function of the increase in resistance through the drain and source interconnects as one moves further away from the drain and source contacts.

Figure 5:
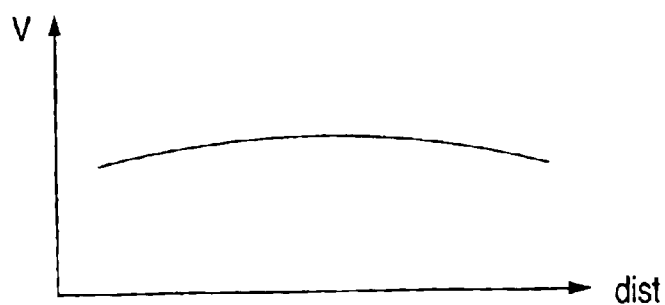
FIG. 5 shows a voltage distribution curve along the length of the drain interconnect of the prior art array of FIG. 3.
Figure 6:
FIG. 6 shows the polygate structure defined based on the current distribution of FIG. 5.

FIG. 5 shows a graph of voltage changes across the polygate as one moves from one end of the structure to the other. As can be seen the voltage is at a maximum at the center where contacts are, and drops off toward both ends due to a potential drop across the drain and source interconnects. FIG. 6 shows a gate configuration that corresponds in length at the various locations along its width, to the voltage that would exist across the polygate if the polygate length were not adjusted.

It will be appreciated that the relationship between the voltage change and an unaltered device and the polygate length change that is required to compensate for the voltage change, can be determined in a number of ways. For example, the voltage can be measure at various locations along the width of an unaltered device and the length of the polygate adjusted accordingly to achieve the corresponding reduction in resistance across the polygate to compensate for the decrease in voltage at each measured location. Instead simulation results can be used to design the ideal polygate configuration.

The effect of compensating for the voltage reduction further away from the drain and source contacts, is that the array works more efficiently by fully utilizing each transistor in the array. However, optimization of the polygate length change, e.g., by extraction and simulation is important to ensure that transistor leakage and hot electron boundary considerations are not violated by making the polygate too short.

While the present invention was described specifically for rectangular NMOS arrays, it will be appreciated that similar benefits can be achieved with other power MOS arrays, such as a honeycomb-like arrays of LDMOS devices.

What is claimed is:

1. A MOS array having a single polygate supporting a plurality of sources that are electrically connected to each other and provided with a source contact and a plurality of drains that are electrically connected to each other and provided with a drain contact, each source being located opposite a drain, wherein the polygate has a non-uniform length along its width, with decreasing length as the distance from the drain contact increases.

2. A MOS array of claim 1, wherein the array includes a common drain interconnect and a common source interconnect.

3. A MOS array of claim 2, wherein the drains and sources define a comb-like configuration.

4. A MOS array of claim 3, wherein, the drains and sources are opposed and staggered to define alternating drain and source regions on both sides of the polygate and extending substantially along the width of the polygate.

5. A MOS array of claim 2, wherein the drain interconnect and source interconnect each have at least one metal contact with the length of the polygate being shorter at greater distances from the at least one contact.

6. A MOS array of claim 5, wherein the array has only one drain contact and one source contact when the drains and sources do not alternate.

7. A MOS array of claim 5, wherein the array has a drain contact on each side of the polygate and a source contact on each side of the polygate to support alternating drain and source regions on each side of the polygate.

8. A MOS array of claim 5, wherein each drain contact is located in the middle of a drain interconnect and each source contact is located in the middle of a source interconnect.

9. A MOS array of claim 8, wherein the polygate is longer in the middle and gets shorter towards the ends.

10. A MOS array of claim 1, wherein the change in length of the polygate is non-linear.

11. A MOS array of claim 9, wherein the change in length of the polygate is non-linear.

12. A MOS array of claim 10, wherein the decrease in length of the further away from the drain and source contacts corresponds to ase in resistance along the interconnect as one moves further from and source contacts.

13. A MOS array of claim 11, wherein the decrease in length of the polygate further away from the drain and source contacts corresponds to the increase in resistance along the interconnect as one moves further from the drain and source contacts.

* * * * *